(12) United States Patent
Shimoda et al.

(10) Patent No.: US 11,289,629 B2
(45) Date of Patent: Mar. 29, 2022

(54) LIGHT-EMITTING DEVICE HAVING COVERING BODY FOR SUPRESSING EMISSION OF STRAY LIGHT FROM SIDE SURFACES THEREOF, AND LIGHT-EMITTING DEVICE MODULE

(71) Applicant: STANLEY ELECTRIC CO., LTD., Tokyo (JP)

(72) Inventors: Yoichi Shimoda, Tokyo (JP); Yasuhiro Ono, Tokyo (JP); Yusuke Yamashita, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 207 days.

(21) Appl. No.: 16/705,122

(22) Filed: Dec. 5, 2019

(65) Prior Publication Data
US 2020/0185574 A1 Jun. 11, 2020

(30) Foreign Application Priority Data
Dec. 7, 2018 (JP) .............................. JP2018-229936

(51) Int. Cl.
*H01L 27/15* (2006.01)
*H01L 33/50* (2010.01)
*H01L 25/075* (2006.01)
*H01L 33/58* (2010.01)

(52) U.S. Cl.
CPC ........ *H01L 33/504* (2013.01); *H01L 25/0753* (2013.01); *H01L 33/58* (2013.01)

(58) Field of Classification Search
CPC ........................... H01L 33/504; H01L 25/0753
See application file for complete search history.

(56) References Cited

U.S. PATENT DOCUMENTS

| | | | | |
|---|---|---|---|---|
| 2006/0076667 | A1* | 4/2006 | Bachmaier | H01L 25/18 257/689 |
| 2007/0092737 | A1* | 4/2007 | Boardman | C08J 3/243 428/447 |
| 2009/0014822 | A1* | 1/2009 | Poo | H01L 27/14683 257/432 |
| 2010/0065879 | A1* | 3/2010 | Kirsch | H01L 33/483 257/99 |
| 2012/0196065 | A1* | 8/2012 | Chen | B44C 1/1712 428/36.4 |

(Continued)

FOREIGN PATENT DOCUMENTS

JP           2010219324 A     9/2010

*Primary Examiner* — Caleb E Henry
(74) *Attorney, Agent, or Firm* — Holtz, Holtz & Volek PC

(57) ABSTRACT

A light-emitting device having high output and high contrast with simple configuration is provided. The light-emitting device includes a substrate, a light-emitting element disposed on the substrate, a light-transmitting member disposed on the light-emitting element, and a covering body disposed on the substrate so as to surround the light-transmitting member and cover a side surface of the light-transmitting member. The covering body has a particle group including a plurality of metal oxide particles having a light scattering property and dispersed in the covering body, and the metal oxide particles existing in the vicinity of the side surface of the covering body have a portion having a bandgap smaller than that of other portions in each particle.

14 Claims, 8 Drawing Sheets

(56) References Cited

U.S. PATENT DOCUMENTS

| | | | |
|---|---|---|---|
| 2012/0267234 A1* | 10/2012 | Reece | C01B 3/042 |
| | | | 204/157.5 |
| 2012/0273811 A1* | 11/2012 | Krauter | H01L 31/0203 |
| | | | 257/88 |
| 2013/0256742 A1* | 10/2013 | Harkness | C09D 7/61 |
| | | | 257/100 |
| 2014/0332774 A1* | 11/2014 | Wu | H01L 51/56 |
| | | | 257/40 |
| 2015/0249120 A1* | 9/2015 | Cheng | H01L 27/3272 |
| | | | 257/40 |
| 2019/0086733 A1* | 3/2019 | Min | G02B 6/0011 |
| 2019/0097101 A1* | 3/2019 | Dorman | H01L 33/505 |
| 2019/0115492 A1* | 4/2019 | Tamma | H01L 33/46 |
| 2019/0198728 A1* | 6/2019 | Tamma | H01L 33/502 |
| 2019/0348577 A1* | 11/2019 | Pathak | H01L 33/504 |

* cited by examiner

LIGHT-EMITTING DEVICE HAVING COVERING BODY FOR SUPRESSING EMISSION OF STRAY LIGHT FROM SIDE SURFACES THEREOF, AND LIGHT-EMITTING DEVICE MODULE

BACKGROUND OF THE INVENTION

1. Field of the Invention

The present invention relates to a light-emitting device including a light-emitting element such as a light-emitting diode, and to a module including a plurality of light-emitting devices.

2. Description of the Related Art

Conventionally, a light-emitting device has been known which combines a light-emitting element that emits light having a predetermined wavelength (emission color) and a wavelength converter that converts the wavelength of light from the light source (for example, Japanese Patent Application Laid-Open No. 2010-219324).

SUMMARY OF THE INVENTION

In some cases, a light-emitting device is required not only to have high output but also to have a clear boundary between light and dark. In this case, it is required that the light-emitting device be configured so as to emit high-output light from a specific region and not to emit light from other regions.

The present invention has been made in view of the foregoing, and it is an object of the present invention to provide a light-emitting device and a light-emitting device module having a simple configuration and high output and suppressing emission of stray light from a side surface.

The light-emitting device according to one aspect of the present invention includes a substrate, a light-emitting element disposed on the substrate, a light-transmitting member disposed on the light-emitting element, and a covering body disposed on the substrate so as to surround the light-transmitting member and cover the side surface of the light-transmitting member, wherein the covering body has a particle group including a plurality of metal oxide particles having a light scattering property and dispersed in the covering body, and those ones of the metal oxide particles existing in the vicinity of the side surface of the covering body have a portion having a bandgap smaller than that of other portions in each particle.

The light-emitting device module according to another aspect of the present invention includes a module substrate and a plurality of light-emitting devices disposed side by side on the module substrate, wherein each of the plurality of light-emitting devices includes an individual substrate, a light-emitting element disposed on the individual substrate, a light-transmitting member disposed on the light-emitting element, and a covering body disposed on the individual substrate so as to surround the light-transmitting member and cover the side surface of the light-transmitting member, wherein the covering body has a particle group including a plurality of metal oxide particles having a light scattering property, and those ones of the metal oxide particles existing in the vicinity of the side surface of the covering body in the particle group have a portion having a bandgap smaller than that of other portions in each particle.

The light-emitting device according to still another aspect of the present invention includes a substrate, a light-emitting element disposed on the substrate, and a covering body disposed on the substrate so as to surround the light-emitting element and cover the side surface of the light-emitting element, wherein the covering body has a particle group including a plurality of metal oxide particles having a light scattering property and dispersed in the covering body, and those ones of the metal oxide particles existing in the vicinity of the side surface of the covering body in the particle group have a portion having a bandgap smaller than that of other portions in each particle.

The light-emitting device according to further another aspect of the present invention includes a substrate, a light-emitting element disposed on the substrate, and a covering body disposed on the substrate so as to surround the light-emitting element and cover the side surface of the light-emitting element, wherein the covering body has a particle group including a plurality of metal oxide particles having a light scattering property and dispersed in the covering body, and the covering body has a region having been irradiated with laser light on the side surface of the covering body.

BRIEF DESCRIPTION OF THE DRAWINGS

Features of the present invention will be described in the following description with reference to the accompanying drawings, in which.

DETAILED DESCRIPTION OF THE INVENTION

Hereinafter, examples of the present invention will be described in detail.

First Embodiment

Figure 1A:
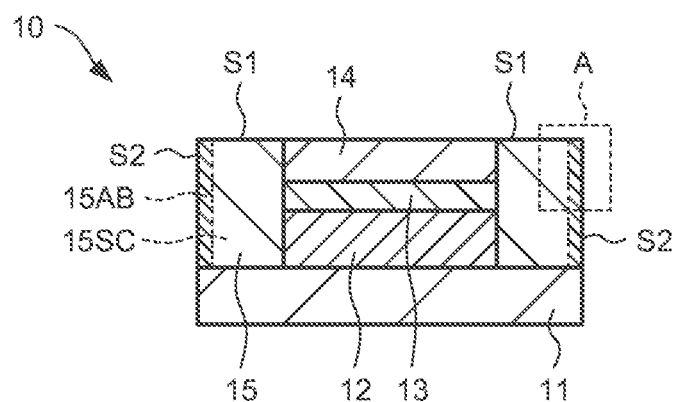
FIG. 1A is a cross-sectional view of a light-emitting device according to a first embodiment.
Figure 1B:
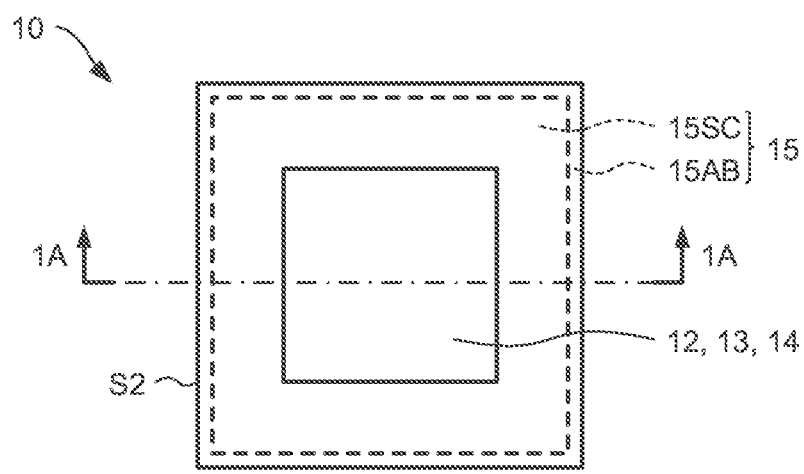
FIG. 1B is a top view of the light-emitting device according to the first embodiment.
Figure 1C:
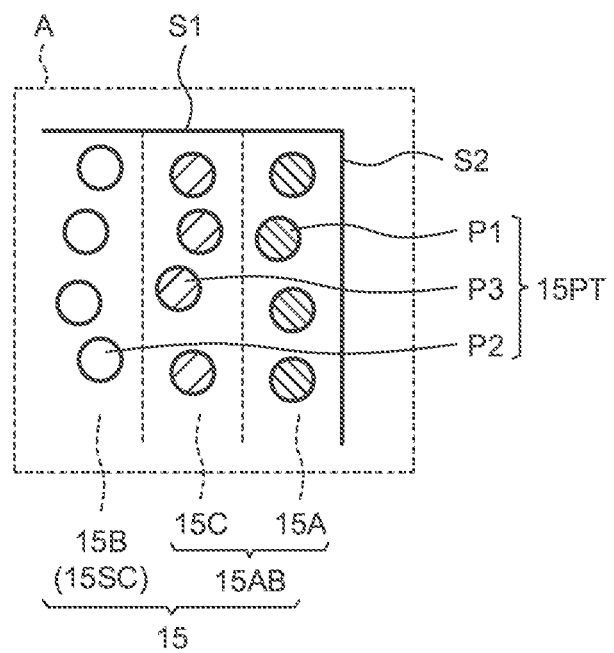
FIG. 1C is an enlarged cross-sectional view of the light-emitting device according to the first embodiment.

FIG. 1A is a cross-sectional view of a light-emitting device 10 according to a first embodiment. FIG. 1B is a schematic top view of the light-emitting device 10. FIG. 1A is a cross-sectional view taken along line 1A-1A of FIG. 1B. FIG. 1C is an enlarged cross-sectional view showing an enlarged part A surrounded by a broken line in FIG. 1A. A configuration of the light-emitting device 10 will be described with reference to FIGS. 1A to 1C.

The light-emitting device 10 includes a substrate 11, a light-emitting element 12 mounted on the substrate 11, and a light-transmitting member 14 bonded to the light-emitting element 12 via a bonding member 13. In this embodiment, the bottom surface of the light-emitting element 12 is disposed on the top surface of the substrate 11. The bonding member 13 is in contact with the top surface of the light-emitting element 12. The bottom surface of the light-transmitting member 14 is in contact with the top surface of the bonding member 13.

The light-emitting device 10 has a covering body 15 formed on the substrate 11 and covering respective side surfaces of the light-emitting element 12, the bonding member 13, and the light-transmitting member 14. The covering body 15 has, as exposed surfaces exposed to the outside, a top surface S1 that is adjacent to the light-transmitting member 14 at an end portion thereof and a side surface S2 (i.e., an outer side surface) that is adjacent to the substrate 11 at an end portion thereof.

In this embodiment, the covering body 15 is formed in an annular, cylindrical shape so as to surround the light-transmitting member 14. The top surface S1 of the covering body 15 is an upper end surface that is adjacent to the top surface of the light-transmitting member 14. The side surface S2 of the covering body 15 is an outer peripheral surface of the covering body 15 that extends, in a direction perpendicular to the substrate 11, from the substrate 11.

Hereinafter, a detailed configuration of the light-emitting device 10 will be described. First, in this embodiment, the substrate 11 is a mounting substrate having a mounting surface for the light-emitting element 12, on which the light-emitting element 12 is mounted. The substrate 11 has a first wiring and a second wiring formed on the mounting surface and connected to the light-emitting element 12. The substrate 11 has a first connection electrode and a second connection electrode that are formed on a surface opposite to the mounting surface (i.e., a back surface), and electrically connected to the first wiring and the second wiring, respectively.

The light-emitting element 12 is, for example, a semiconductor light-emitting element such as a light-emitting diode. In this embodiment, the light-emitting element 12 includes a semiconductor layer (not shown) formed of a nitride-based semiconductor. The light-emitting element 12 emits, for example, light having a wavelength of 420 to 470 nm (which may be referred to as blue light hereinafter).

The light-emitting element 12 includes, for example, a semiconductor layer including a light-emitting layer, and a supporting substrate supporting the semiconductor layer. The supporting substrate is formed of a silicon substrate, for example. The light-emitting element 12 has first and second electrodes connected to the first and second wirings of the substrate 11, respectively.

For example, the light-emitting element 12 includes the supporting substrate, the semiconductor layer formed on a first main surface of the supporting substrate, the first electrode formed on the first main surface of the supporting substrate, and the second electrode formed on a second main surface of the supporting substrate opposite to the first main surface thereof. In this case, the light-emitting element 12 is mounted on the mounting surface of the substrate 11 so that the second main surface is adjacent to the substrate 11. The second electrode is connected to the second wiring of the substrate 11 via a conductive adhesive (also referred to as a conductive bonding member). The first electrode is connected to the first wiring of the substrate 11 via a gold wire.

Note that the configuration of the light-emitting element 12 is not limited to this. For example, the light-emitting element 12 may have a growth substrate used for crystal growth of the semiconductor layer. In this case, for example, the light-emitting element 12 includes the growth substrate, the semiconductor layer grown on the growth substrate, and the first electrode and the second electrode formed on the semiconductor layer. In this case, the growth substrate in the light-emitting element 12 is adhered or bonded to the substrate 11. The first and second electrodes of the light-emitting element 12 are connected to the first and second wirings of the substrate 11 through gold wires.

As another configuration of the light-emitting element 12, the semiconductor layer may be mounted on the mounting surface of the substrate 11. In this case, the light-emitting element 12 includes the supporting substrate (or a growth substrate, the same applies hereinafter), the semiconductor layer formed on the supporting substrate, and the first and second electrodes formed on the semiconductor layer. The first and second electrodes of the light-emitting element 12 are bonded to the substrate 11 via a conductive adhesive (or a conductive bonding member) (also referred to as flip-chip bonding). In this case, the semiconductor layer is disposed on the substrate 11, and the supporting substrate is disposed on the semiconductor layer.

In this embodiment, a case where the light-emitting element 12 has a rectangular top surface shape (square in this embodiment) when viewed from a direction perpendicular to the mounting surface of the substrate 11 for the light-emitting element 12 will be described. However, the top surface shape of the light-emitting element 12 is not limited to a rectangular shape, and may be any of various shapes such as another quadrangle shape, a circular shape, and an elliptical shape. In this embodiment, the top surface of the light-emitting element 12 (for example, the surface of the semiconductor layer or the supporting substrate on the opposite side to the substrate 11) functions as a light extraction surface of the light-emitting element 12.

The bonding member 13 has a characteristic of transmitting the light emitted from the light-emitting element 12. The bonding member 13 transmits at least visible light, for example. Examples of the bonding member 13 may include an epoxy resin, a silicone resin, and a low-melting-point glass. In this embodiment, the bonding member 13 is formed of a silicone resin.

The bonding member 13 may include a wavelength converter, for example, a phosphor, for converting the wavelength of the light emitted from the light-emitting element 12. Examples of the phosphor used may include a green phosphor that converts blue light into green light, a yellow phosphor that converts blue light into yellow light, and a red phosphor that converts blue light into red light.

The configuration of the bonding member 13 is not limited to this. For example, the bonding member 13 may be composed of a nanoparticle sintered body of a metal oxide that transmits light emitted from the light-emitting element 12 and light converted by the wavelength converter.

The light-transmitting member 14 is disposed on the top surface of the bonding member 13. For example, the light-transmitting member 14 has a plate-like shape. The light-transmitting member 14 has a characteristic of transmitting light emitted from the light-emitting element 12 and/or light converted by the wavelength converter, for example, a characteristic of transmitting at least visible light. Examples of the light-transmitting member 14 used may include a glass plate, a sapphire plate, and a YAG (Yttrium Aluminum Garnet) plate.

The light-transmitting member 14 may include a wavelength converter, for example, a phosphor, for converting the wavelength of the light emitted from the light-emitting element 12. Examples of the phosphor used may include a green phosphor that converts blue light into green light, a yellow phosphor that converts blue light into yellow light, and a red phosphor that converts blue light into red light. In this embodiment, the light-transmitting member 14 is formed of a YAG plate including a phosphor (YAG: Ce phosphor).

The configuration of the light-transmitting member 14 is not limited to this. For example, the light-transmitting member 14 may be composed of an acrylic resin, a polycarbonate resin, an epoxy resin, a silicone resin, a fluororesin, or a nanoparticle sintered body of a metal oxide that transmits light emitted from the light-emitting element 12 and light converted by the wavelength converter.

The top surface of the light-transmitting member 14 functions as a light extraction surface of the light-emitting device 10. In this embodiment, the top surface of the light-transmitting member 14 has the same shape as the top surface of the light-emitting element 12, for example, a rectangular shape. However, the top surface shape of the light-transmitting member 14 is not limited to a rectangular shape, and may be a shape different from the top surface shape of the light-emitting element 12. For example, the side surface of the light-transmitting member 14 may be formed in a stepped shape, or may be inclined with respect to the top surface.

A translucent organic film (not shown) may be provided on the top surface of the light-transmitting member 14. As the organic film, for example, a resin film using a fluororesin may be mentioned. By covering the top surface of the light-transmitting member 14 with the fluororesin, it is possible to suppress the adhesion of dirt to the light extraction surface. It is thus possible to suppress a decrease in light extraction efficiency from the light-emitting device 10.

In this embodiment, the covering body 15 is formed on the substrate 11 while covering each of the side surfaces of the light-emitting element 12, the side surfaces of the bonding member 13, and the side surfaces of the light-transmitting member 14. The covering body 15 has the top surface S1 and the side surface S2 as exposed surfaces exposed to the outside.

Specifically, in this embodiment, the top surface S1 of the covering body 15 is a surface portion of the covering body 15 extending from the end portion of the top surface (i.e., the light extraction surface) of the light-transmitting member 14 along a direction parallel to the mounting surface of the substrate 11 for the light-emitting element 12. The outer side surface S2 of the covering body 15 is a surface portion of the covering body 15 extending from the mounting surface of the substrate 11 for the light-emitting element 12 along a direction perpendicular to the mounting surface.

The covering body 15 has a bottom surface that is in contact with the mounting surface of the substrate 11 for the light-emitting element 12, and a side surface (inner side surface) that is in contact with each of the side surfaces of the light-emitting element 12, the side surface of the bonding member 13, and the side surfaces of the light-transmitting member 14.

In this embodiment, a case where the covering body 15 is in contact with the entire side surfaces of the light-transmitting member 14 will be described. However, the covering body 15 may be in contact with only a part of the side surfaces of the light-transmitting member 14. For example, the covering body 15 may cover a partial region of the side surface of the light-transmitting member 14 including the end portion that is adjacent to the top surface (light extraction surface) of the light-transmitting member 14 (i.e., only the upper region of the side surface of the light-transmitting member 14).

Next, the inner structure of the covering body 15 will be described with reference to FIGS. 1C and 1D. First, as shown in FIG. 1C, the covering body 15 has a particle group 15PT including a plurality of titanium oxide particles dispersed in the covering body 15 (first, second, and third titanium oxide particles P1, P2, and P3 are shown in FIG. 1C).

In this embodiment, the covering body 15 includes a medium (matrix) in which the particle group 15PT is dispersed. Examples of the medium may include a thermosetting silicone resin, and a thermosetting epoxy resin. That is, the covering body 15 is formed of a resin body containing particles. In this embodiment, the resin body as the medium has a characteristic of transmitting ultraviolet light and visible light. Note that, in this embodiment, the covering body 15 functions as a sealing body for sealing the light-emitting element 12 and the wiring and the like on the substrate 11.

Figure 1D:
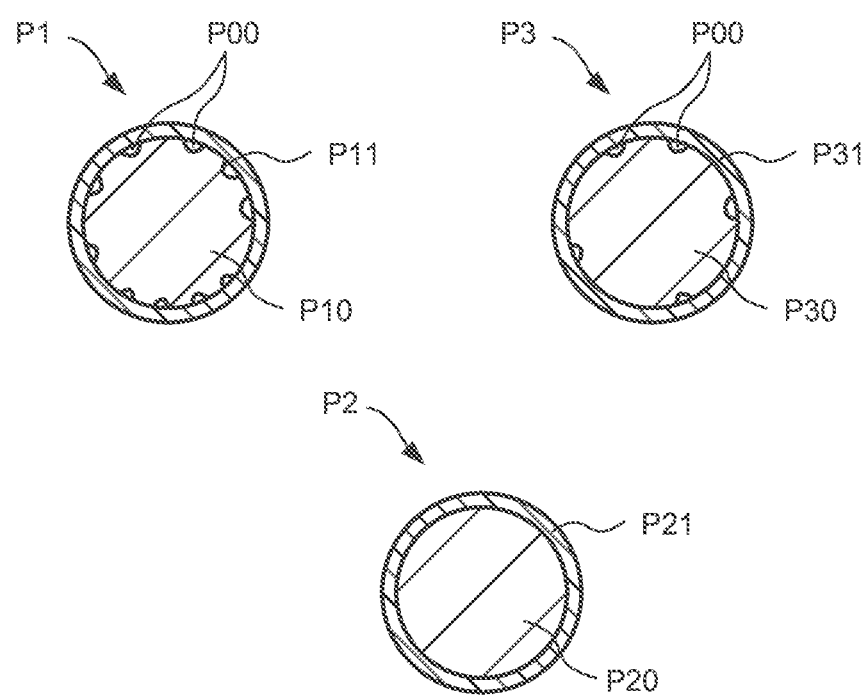
FIG. 1D is a cross-sectional view of particles in a covering body in the light-emitting device according to the first embodiment.

As shown in FIG. 1D, the respective first to third titanium oxide particles P1 to P3 have particle bodies P10, P20, and P30, and covering films P11, P21, and P31 covering the particle bodies P10, P20, and P30, respectively.

Specifically, in this embodiment, the first titanium oxide particle P1 has the particle body P10 that is a portion formed of titanium oxide, and the covering film P11 that covers the surface of the particle body P10 to protect the particle body P10. The covering film P11 is, for example, a film formed of an organic substance such as alumina, silica, or polyol. Similarly to this, the second and third titanium oxide particles P2 and P3 have particle bodies P20 and P30 and covering films P21 and P31 covering the respective surfaces of the particle bodies P20 and P30, respectively. In this embodiment, the covering films P11 to P31 protect the particle bodies P10 to P30 from deterioration by ultraviolet rays.

Next, as shown in FIG. 1D, each of the first and third titanium oxide particles P1 and P3 in the particle group 15PT has a portion P00 having a bandgap smaller than that of the other portions in each of the particle bodies P10 and P30.

The portion P00 is a portion in which oxygen is deficient in titanium oxide. In the following, the portion P00 is referred to as an oxygen deficient portion.

As shown in FIG. 1C, in this embodiment, the particle group 15PT includes the first to third titanium oxide particles P1 to P3 dispersed such that the density of the oxygen deficient portion P00 in the respective particles decreases from the side surface S2 of the covering body 15 toward the light-transmitting member 14. For the sake of clarity of the drawing, the first and third titanium oxide particles P1 and P3 are hatched in FIG. 1C. In this embodiment, each of the titanium oxide particles P1 to P3 is formed of titanium dioxide ($TiO_2$) having a rutile-type crystalline structure.

The density of the oxygen deficient portion P00 in each of the first to third titanium oxide particles P1 to P3 is, for example, a ratio occupied by the oxygen deficient portion P00 in each particle, and is, for example, the occupied area of the oxygen deficient portion P00 on the surface of each of the particle bodies P10 to P30.

In this embodiment, in the first titanium oxide particles P1 dispersed in the region closest to the side surface S2, the density of the oxygen deficient portion P00 in the first titanium oxide particle P1 is the highest in the particle group 15PT. That is, the first titanium oxide particles P1 have the oxygen deficient portion P00 at a first density.

For example, the oxygen deficient portion P00 of the first titanium oxide particle P1 has a bandgap energy smaller than the energy of visible light (in particular, the energy of the wavelength of visible light). For example, the oxygen deficient portion P00 in the first titanium oxide particle P1 has a bandgap energy (for example, about 1.5 eV) smaller than the energy of the light emitted from the light-emitting element 12 (blue light in this embodiment) and the energy of the outgoing light from the light-transmitting member 14 (blue light and yellow light in this embodiment).

In the second titanium oxide particles P2 dispersed in the region closest to the light-emitting element 12 in the covering body 15, the density of the oxygen deficient portion P00 in the second titanium oxide particle P2 is the lowest in the particle group 15PT. That is, the second titanium oxide particles P2 have the oxygen deficient portion P00 at a second density lower than the first density.

For example, the second titanium oxide particles P2 have almost no oxygen deficient portion P00, as shown in FIG. 1D. Thus, for example, the second titanium oxide particle P2 has a bandgap energy that is greater than the energy of the emitted light from the light-emitting element 12 in any portion (i.e., substantially in the entirety).

For example, if the second titanium oxide particle P2 has a rutile-type crystalline structure, the second titanium oxide particle P2 has a bandgap energy of 3.0 eV. If the second titanium oxide particle P2 has an anatase-type crystalline structure, the second titanium oxide particle P2 has a bandgap energy of 3.2 eV.

In the third titanium oxide particles P3 dispersed between the first and second titanium oxide particles P1 and P2, the oxygen deficient portion P00 (for example, a portion having a bandgap energy of 1.5 eV) in the third titanium oxide particle P3 is provided at a density between those of the first titanium oxide particle P1 and the second titanium oxide particle P2 in the particle group 15PT. That is, the third titanium oxide particles P3 have the oxygen deficient portion P00 at a third density, which is a density between the first density and the second density.

Note that it is understood that the bandgap of the crystal of titanium oxide is reduced due to oxygen defect. More specifically, an intermediate level is formed between the valence band and the conduction band of titanium oxide due to oxygen defect. Herein, the bandgap is an energy gap between the intermediate level, and the valence band or the conductive band.

Herein, the bandgaps in the first to third titanium oxide particles P1 to P3 (that is, the local bandgap in each particle) will be described. A crystal having a bandgap has an optical characteristic of absorbing light having a wavelength whose energy is greater than the bandgap energy and transmitting light having a wavelength whose energy is smaller than the bandgap energy.

In this embodiment, the oxygen deficient portion P00 in each of the first and third titanium oxide particles P1 and P3 has a bandgap energy smaller than the bandgap energy corresponding to the wavelength of visible light. Therefore, each of the first and third titanium oxide particles P1 and P3 absorbs visible light by the oxygen deficient portion P00. In this embodiment, the first and third titanium oxide particles P1 and P3 are thus observed to be black or gray because visible light is absorbed under observation using white visible light.

In this embodiment, since each of the second titanium oxide particles P2 has almost no oxygen deficient portion P00, visible light is transmitted and scattered. Therefore, in this embodiment, each of the second titanium oxide particles P2 is observed to be white under observation using white visible light.

For example, the energy of light having a wavelength of 450 nm (blue light in the atmosphere) is about 2.76 eV, and the energy of light having a wavelength of 630 nm (red light in the atmosphere) is about 1.67 eV. Therefore, the first and third titanium oxide particles P1 and P3 including the oxygen deficient portion P00 having a bandgap energy of 1.5 eV function as particles that absorb visible light. On the other hand, the second titanium oxide particle P2 including no oxygen deficient portion P00 has a bandgap energy of 3.2 eV, and thus functions as a scattering-reflection particle that does not absorb visible light.

In this embodiment, when the regions in which the first, second, and third titanium oxide particles P1, P2, and P3 are dispersed in the covering body 15 are defined as first, second, and third regions (or first, second, and third particle layers) 15A, 15B, and 15C, respectively, the first and third regions 15A and 15C function as a visible light absorption region (hereinafter, simply referred to as an absorption region) 15AB that absorbs visible light. On the other hand, the second region 15B functions as a visible light scattering-reflection region (hereinafter, simply referred to as a scattering-reflection region) 15SC that scatters and reflects visible light.

The first and third titanium oxide particles P1 and P3 are dispersed only in a region near the side surface S2 of the covering body 15. For example, the first and third titanium oxide particles P1 and P3 are dispersed only in a region within a thickness or depth range of 20 μm or less from the side surface S2. The covering body 15 thus functions as the absorption region 15AB in the vicinity of the side surface S2, and also functions as the scattering-reflection region 15SC in the inside thereof.

In this embodiment, the first to third titanium oxide particles P1 to P3 are dispersed in the covering body 15 (that is, in the medium) with a uniform dispersion density as a whole. However, the first to third titanium oxide particles P1 to P3 may be dispersed so that the dispersion density (i.e., the contained amount) gradually increases from the top surface S1 of the covering body 15 toward the substrate 11. For example, the particles in the particle group 15PT may be dispersed at a higher density in a region near the substrate 11 (i.e., lower region) than in a region near the top surface S1 (i.e., upper region) in the covering body 15.

The first, second, and third titanium oxide particles P1, P2, and P3 have the covering films P11, P21, and P31, respectively. As a result, the first to third titanium oxide particles P1 to P3 can be made to have resistance to yellowing by ultraviolet rays (that is, yellowing resistance) and weather resistance. However, when resistance to yellowing by ultraviolet rays or weather resistance is not required, the first to third titanium oxide particles P1 to P3 may not have the covering films P11 to P31.

Figure 2A:
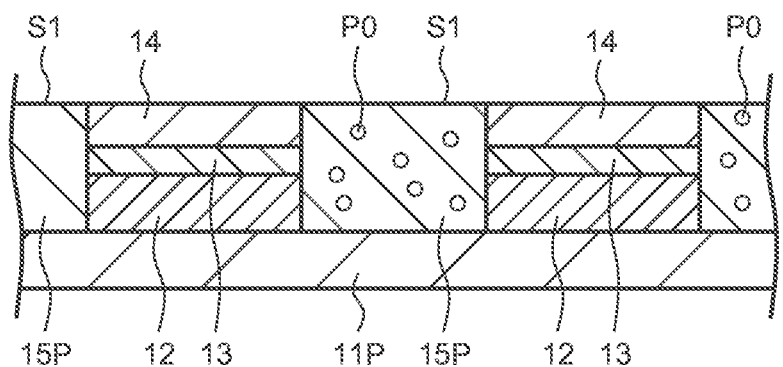
FIG. 2A is a diagram illustrating a method for manufacturing the light-emitting device according to the first embodiment.
Figure 2B:
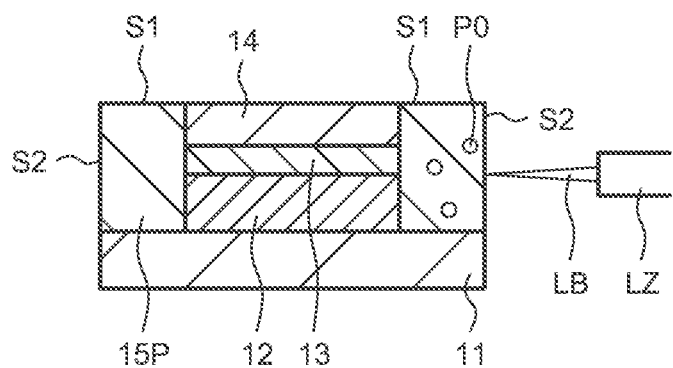
FIG. 2B is a diagram illustrating the method for manufacturing the light-emitting device according to the first embodiment.
Figure 2C:
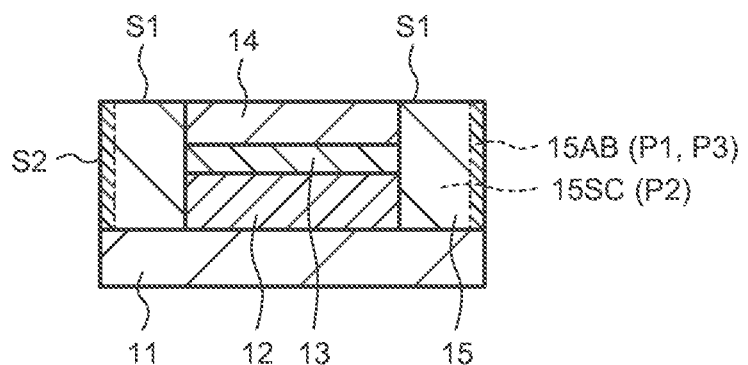
FIG. 2C is a diagram illustrating the method for manufacturing the light-emitting device according to the first embodiment.

FIG. 2A, FIG. 2B, and FIG. 2C are diagrams showing respective steps of a method for manufacturing the light-emitting device 10. Each of FIGS. 2A to 2C is a cross-sectional view similar to that of FIG. 1A in each step. The method for manufacturing the light-emitting device 10 will be described with reference to FIGS. 2A to 2C.

FIG. 2A is a diagram showing a substrate 11P on which light-emitting elements 12, bonding members 13, light-transmitting members 14, and particle-containing resins 15P are formed. In this embodiment, first, a plurality of the light-emitting elements 12 are disposed on the substrate 11P having wiring, and bonded to each other (Step 1). Next, a silicone resin is applied as a bonding member 13 on the light-emitting element 12 (Step 2). A YAG plate containing a phosphor is disposed on the bonding member 13 as the light-transmitting member 14 and bonded (Step 3).

Next, a silicone resin containing the same titanium oxide particles P0 as the second titanium oxide particles P2 is filled as the particle-containing resin 15P in the region between the light-transmitting members 14 on the substrate 11P (Step 4). Then, the particle-containing resin 15P is heated to be cured (Step 5). In this embodiment, rutile type titanium dioxide having an average particle diameter of 250 nm and a bandgap energy of 3.0 eV was used as the titanium oxide particles P0. The concentration of the titanium oxide particles P0 in the particle-containing resin 15P was 16 wt %.

FIG. 2B is a diagram illustrating the particle-containing resin 15P and the substrate 11 when the side surface S2 of the particle-containing resin 15P is irradiated with the laser beam. First, after the particle-containing resin 15P has been cured, the substrate 11P is cut into individual pieces for each light-emitting element 12, that is, for each light-transmitting member 14 (Step 6). In this embodiment, cut surfaces extending perpendicularly to the substrate 11 are formed in the individual particle-containing resin 15P. This cut surface becomes the side surface S2 of the particle-containing resin 15P.

Then, the side surface S2 of the particle-containing resin 15P is irradiated with the laser beam LB while supporting the substrate 11 (Step 7). In this embodiment, a laser light source LZ for emitting the laser beam LB having a wavelength of 355 nm was prepared. The side surface S2 of the particle-containing resin 15P is irradiated with the laser beam LB while scanning.

In this embodiment, the side surface S2 of the particle-containing resin 15P was irradiated with the laser beam LB having a beam diameter of ϕ45 μm and an output of 50 kW/cm$^2$ while moving the laser beam LB at a rate of 1000 mm/sec. The energy of light having a wavelength of 355 nm is about 3.5 eV, and the bandgap energy of rutile-type titanium dioxide is 3.0 eV. Therefore, the energy of the laser beam LB is larger than the bandgap energy of the titanium oxide particles P0. The laser beam LB is thus absorbed by the titanium oxide particles P0.

As a result, the titanium oxide particles P0 having been irradiated with the laser beam LB are altered such that oxygen atoms in the particles are desorbed. The adjustment of the irradiation intensity, irradiation time, focal position, and the like of the laser beam LB can allow the laser beam LB to be irradiated only to the titanium oxide particles P0 in the vicinity of the side surface S2. Therefore, the titanium oxide particles having the largest oxygen defect in the vicinity of the side surface S2 of the particle-containing resin 15P are generated, and the titanium oxide particles having the smallest degree of oxygen defect are generated as they are apart from the side surface S2.

As a result, the titanium oxide particles P0 having been irradiated with the laser beam LB relatively strongly in the vicinity of the side surface S2 of the particle-containing resin 15P become the titanium oxide particles having the oxygen deficient portion P00 at a high density, that is, become the first titanium oxide particles P1. The titanium oxide particles P0 slightly away from the side surface S2 of the particle-containing resin 15P become the third titanium oxide particles P3 having a relatively small amount of the oxygen deficient portion P00.

The titanium oxide particles P0 existing apart from the side surface S2 by a predetermined distance (that is, by a distance at which the laser beam LB is shielded by the titanium oxide particles) are not affected by the laser irradiation and are not altered. Therefore, for example, the titanium oxide particles P0 existing in the vicinity of the light-emitting element 12 and the light-transmitting member 14 become the titanium oxide particles having almost no oxygen deficient portion P00, that is, become the second titanium oxide particles P2.

In this manner, the laser irradiation can produce the light-emitting device 10 including the covering body 15 containing the plurality of titanium dioxide particles (i.e., the particles group 15PT) dispersed so that the density of the oxygen deficient portion P00 is gradually lowered (FIG. 2C).

In the step of irradiating with the laser beam LB (Step 7), it is preferable to adjust the output of the laser light source LZ so as not to alter other materials, for example, the medium of the covering body 15 (for example, a silicone resin), the bonding member 13, the light-transmitting member 14, and the like. For example, the irradiation with the laser beam LB under the aforementioned conditions can alter only the titanium oxide particles P0 while suppressing the alteration of other materials.

The inventors of the present application have confirmed that the laser beam LB of the condition (and having the output in the range of 25 to 75 kW/cm$^2$) does not alter the qualities of the silicone resin as the medium of the covering body 15, the bonding member 13, and the YAG plate as the light-transmitting member 14. In this embodiment, a silicone resin having a transmittance of 60% or more with respect to light having a wavelength of 355 nm was used as the medium of the covering body 15.

The manufacturing method of the light-emitting device 10 is not limited to this. For example, after the particle-containing resin 15P is applied and left to stand for a predetermined period of time, and then the particle-containing resin 15P is heated to cure the resin 15P while the titanium oxide particles P0 are precipitated. As a result, it is possible to form the covering body 15 in which the dispersion density of the titanium oxide particles P0 on the top surface S1 side is lowered.

Figure 3:
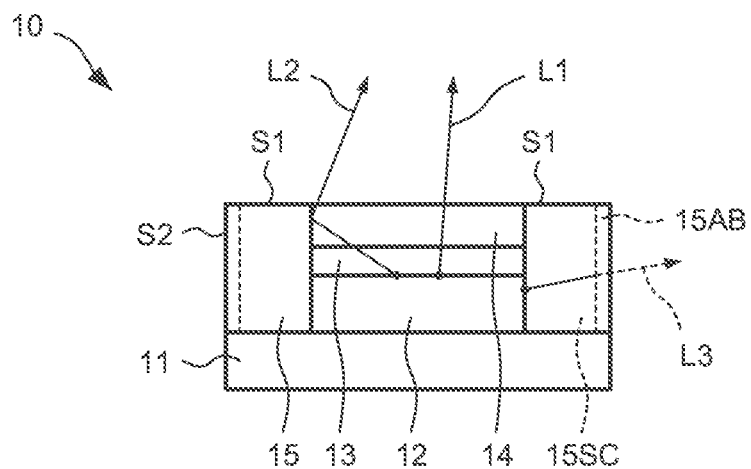
FIG. 3 is a diagram schematically illustrating paths of light in the light-emitting device according to the first embodiment.

FIG. 3 is a diagram schematically illustrating paths of light in the light-emitting device 10. First, most of the light emitted from the light-emitting element 12 passes through the bonding member 13 and the light-transmitting member 14 as the light L1 in the drawing, and is extracted to the outside from the light extraction surface which is the top surface of the light-transmitting member 14.

Next, the light entering the scattering-reflection region 15SC of the covering body 15 from the side surface of the light-transmitting member 14 is reflected by the scattering-reflection region 15SC like the light L2 and returned to the light-transmitting member 14. Light like the light L2 is extracted from the top surface of the light-transmitting member 14 to the outside.

On the other hand, a part of the light incident on the covering body 15 from the side surface of the light-transmitting member 14 may propagate within the covering body 15 to reach the side surface S2 of the covering body 15, as in the case of the light L3. Such light enters the absorption region 15AB and is absorbed by the same. Light such as the light L3 is sufficiently attenuated even when it is not completely absorbed in the absorption region 15AB. Therefore, there is little light extracted from the side surface S2 of the covering body 15.

It is thus possible to suppress emission of stray light from the side surface S2 while suppressing the decrease in the intensity of light taken out to the outside, and to obtain light of high contrast. For example, when the absorption region 15AB is not provided in the side surface S2 of the covering body 15, light such as the light L3 is extracted from the side surface S2 of the covering body 15. In this case, the light L3 becomes stray light, which causes noise to be superimposed on light extracted to the outside.

Specifically, for example, when the light-emitting device 10 is used for illumination applications, the light-emitting device 10 is entirely accommodated in a housing of a lighting apparatus. The light extracted from the light-emitting device 10 is projected from the lighting apparatus toward a region or space to be irradiated through various optical systems such as a lens. Therefore, it is assumed that light such as the light L3 enters the optical system from an unintended direction.

Thus, for example, the light L3 may provide unintended intensity changes and intensity distribution for light extracted from the designed light extraction surface (for example, light L1 and L2). On the other hand, since the covering body 15 has the absorption region 15AB in the vicinity of the side surface S2, light such as the light L3 is prevented from being extracted from the light-emitting device 10.

Figure 4:
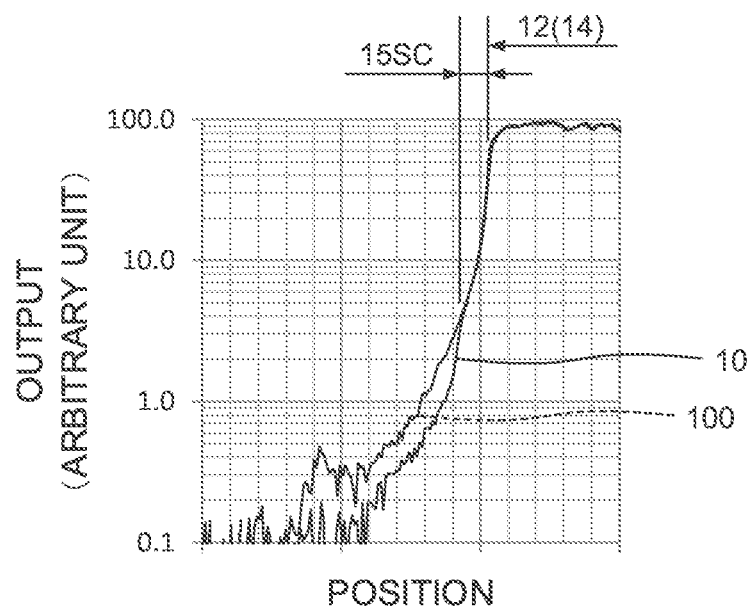
FIG. 4 is a diagram illustrating a light output from the light-emitting device according to the first embodiment.

FIG. 4 is a diagram showing the distribution of the light output from the light-emitting device 10. The horizontal axis of FIG. 4 indicates the position of the light-emitting device 10 along line 1A-1A of FIG. 1B, and the vertical axis indicates the light output (for example, the value of the luminance normalized by the maximum value).

In FIG. 4, as a light-emitting device 100 according to Comparative Example, a light-emitting device having a covering body in which only the second titanium oxide particles P2 are dispersed instead of the covering body 15 of this embodiment was prepared, and the measurement result of the output from the light-emitting device 100 is indicated by a broken line while superimposed on the measurement result of the light-emitting device 10. Note that the maximum output values of the light-emitting devices 10 and 100 were substantially the same as each other. That is, it can be understood that the light-emitting device 10 is a light-emitting device having high contrast without lowering the output.

In this example, the absorption region 15AB is not provided in the top surface S1 of the covering body 15. It is thus possible to suppress a decrease in the intensity of light extracted from the light-emitting device 10. For example, light incident on the top surface S1 of the covering body 15 after repeating reflection in the housing can be extracted to the outside in the same manner as those for the light L1 and L2. As compared with the case where the absorption region 15AB is provided in the top surface S1 of the covering body 15, for example, the entire covering body 15, the decrease in the intensity of light to be extracted to the outside is thus suppressed.

Next, the relationship between the intensity of the laser beam LB when the absorption region 15AB is formed (that is, the power density of the laser beam LB) and the intensity of the light outputted from the side surface S2 will be described. Table 1 shows the measurement results of the intensity of outgoing light from the side surface S2 of the light-emitting device 10 (Example 1) when the absorption region 15AB is formed by the laser beam LB having different intensities, and the measurement results of the intensity of outgoing light from the side surface S2 of the light-emitting device 100 (Comparative Example, i.e., a light-emitting device in which the absorption region 15AB is not provided).

TABLE 1

| SAMPLE | THICKNESS OF COVERING BODY D(mm) | LASER OUTPUT (kW/cm^2) | LIGHT INTENSITY AT SIDE SURFACE (NORMALIZED VALUE) | SPECIFIC INTENSITY (FOMULA) |
| --- | --- | --- | --- | --- |
| EXAMPLE 1-1 | 0.1 | 25 | 2.4 | 0.30 (2.4/8.0) |
| EXAMPLE 1-2 | 0.1 | 50 | 2.0 | 0.25 (2.0/8.0) |
| EXAMPLE 1-3 | 0.1 | 75 | 1.7 | 0.22 (1.7/8.0) |
| COMPARATIVE EXAMPLE | 0.1 | UNIRRADIATED | 8.0 | — |

More specifically, Table 1 shows the thickness of the covering body 15 (i.e., the distance from the side surface S2 to the light-transmitting member 14), the output of the laser light source LZ, the light intensity at the side surface S2, and the specific intensity of the light intensity at the side surface S2 with respect to Comparative Example in each of the measurement samples. Example 1-1 is a sample of the light-emitting device 10 produced by setting the laser output to 25 kW/cm². Similarly, Examples 1-2 and 1-3 are samples of the light-emitting device 10 produced by setting the laser output to 50 and 75 kW/cm², respectively.

The numerical value of the light intensity of the side surface S2 shown in Table 1 is an intensity value when the intensity per unit area of the light outputted from the light-transmitting member 14 is normalized to 100. The numerical value of the specific intensity is the intensity value at the side surface S2 of each sample of the light-emitting device 10 when the light intensity at the side surface S2 of the light-emitting device 100 of Comparative Example (8.0 in this embodiment) is 1.

As shown in Table 1, the light intensity at the side surface S2 decreases to 2.4, 2.0, and 1.7 as the laser output increases. Similarly, the specific intensity becomes 0.3, 0.25, and 0.22 as the laser output increases. Therefore, it can be understood that the increased laser output can increase the density of the oxygen deficient portion P00 in the first and third titanium oxide particles P1 and P3, and also increase the amount of light absorbed in the absorption region 15AB. It can be understood that the light intensity at the side surface S2 is reduced by about ¼ due to the absorption region 15AB.

As described above, the covering body 15 has high reflectivity for most of the light that enters the covering body 15 from the light-emitting element 12, the bonding member 13, and the light-transmitting member 14, and has absorptivity for light propagating to the side surface S2 of the covering body 15, which is slightly present. The light-emitting device 10 thus can output light of high output without sacrificing the decrease in the output of light.

The absorption region 15AB of the covering body 15 can be easily formed by simply adding the irradiation process of the laser beam LB (Step 7). It is thus possible to easily provide the light-emitting device 10 having high output and high contrast.

In this embodiment, the resin body which is the dispersion medium of the particle group 15PT is integrally formed. For example, the covering body 15 has one resin matrix that supports each of the first to third titanium oxide particles P1 to P3 and transmits visible light and ultraviolet light. There is no boundary of the medium between the first to third regions 15A to 15C. Therefore, even when the absorption region 15AB is provided, the mechanical strength of the covering body 15 is maintained, and the optical function is stabilized as described above. The covering body 15 and the light-emitting device 10 thus have high quality and enhanced life.

In this embodiment, the particle group 15PT has a uniform dispersion density as a whole in the covering body 15. Therefore, each of the first to third titanium oxide particles P1 to P3 are dispersed in the covering body 15 at a density within the same range as each other. Even when the absorption region 15AB is provided, the thermal expansion coefficient of the covering body 15 as a whole is thus made uniform, thereby maintaining the mechanical strength of the covering body 15. Therefore, the covering body 15 and the light-emitting device 10 have high quality and enhanced life.

As described above, the dispersion density of the particle group 15PT in the covering body 15 may be gradually lowered toward the substrate 11. For example, when the dispersion densities of the first to third titanium oxide particles P1 to P3 on the side of the substrate 11 are increased and the dispersion densities of the first to third titanium oxide particles P1 to P3 on the side of the top surface S1 are decreased, resin cracking at the top surface S1 of the covering body 15 can be suppressed.

More specifically, for example, when the above-described Step 4 is performed, the covering body 15 is formed by using the particle-containing resin 15P which contains the titanium oxide particles P0 in the contained amount of 32 wt %, and performing a standing-still step (i.e., a step of precipitating the titanium oxide particles P0). In this case, the contained amount of the titanium oxide particles (i.e., the first to third titanium oxide particles P1 to P3) in the vicinity of the top surface S1 in the covering body 15 may be set to about 16 wt %. In this case, the light absorption characteristic in the absorption region 15AB and the light scattering characteristic in the scattering-reflection region 15SC in the vicinity of the top surface S1 can be maintained, and further, resin cracking of the covering body 15 can be prevented.

In the vicinity of the substrate 11 in the covering body 15, a portion where the density of the particle group 15PT is high is exposed. However, since the portion of the side surface S2 of the covering body 15 in the vicinity of the substrate 11 is adjacent to the substrate 11, resin cracking is hardly generated.

In this embodiment, the covering body 15 includes a thermosetting epoxy resin or silicone resin having a refractive index in the range of 1.4 to 1.55 as a resin medium. The particle group 15PT includes, for example, anatase-type titanium oxide particles having a refractive index of about 2.5, or rutile-type titanium oxide particles having a refractive index of about 2.7. In consideration of scattering light in the covering body 15, it is preferable that the particle group 15PT (in particular, the second titanium oxide particle P2) have a higher refractive index than the resin medium.

The average particle diameter of each of the first to third titanium oxide particles P1 to P3 in the particle group 15PT of the covering body 15 is preferably in the range of 150 to 350 nm in consideration of obtaining good diffuse reflection. When a ratio of the average particle diameter of the first to third titanium oxide particles P1 to P3 is adjusted within the range of about 1 to ¼ with respect to the wavelength of the light (visible light in this embodiment) that has entered the covering body 15 (wavelength in the medium of the silicone resin, for example), Mie scattering with a high backscattering ratio can be caused, so that extremely good diffuse reflection can be achieved. By adjusting the average particle diameter of the particles in the particle group 15PT in consideration of these factors, the reflectance in the scattering reflection region 15SC can be enhanced. In the absorption region 15AB, light is also taken in and absorbed by the particles with a high probability by the light scattering, and thus the absorptance can be increased.

The concentration of the particle group 15PT in the covering body 15 is preferably in the range of 5 to 70 wt % in consideration of achieving desired light reflectivity and light absorptivity, and is more preferably in the range of 8 to 30 wt % in consideration of ease of manufacture (for example, ease of application of the particle-containing resin 15P) and manufacturing cost. The above-mentioned configuration of the particle group 15PT and medium in the covering body 15 is merely one of possible examples.

As shown in FIG. 1D, each of the first to third titanium oxide particles P1 to P3 has the covering film P11 to P31 (i.e., the titanium oxide particles P0 used for forming each particle have the covering film). Thus, in the step of irradiating with the laser beam LB (Step 7) at the time of manufacturing the light-emitting device 10, oxygen defect can be effectively and stably caused on the surfaces of the particle bodies P10 to P30 by using a high-power laser having a wavelength of 355 nm. Therefore, the absorption region 15AB can be stably formed only in a thin region of several μm to 20 μm from the side surface S2 of the covering body 15.

When the particle diameter of the titanium oxide particles P0 is substantially equal to the wavelength of the laser beam LB in the particle-containing resin 15P, Mie scattering with a large backscattering ratio is caused by the titanium oxide particles P0 in the region within the particle-containing resin 15P. The laser beam LB is thus scattered and reflected in the vicinity of the side surface S2 of the particle-containing resin 15P. As a result, only portions in the vicinity of the side surface S2 of the covering body 15 (that is, in a thin region of several μm to 20 μm from the side surface S2) can be uniformly irradiated with the laser beam LB, so that the absorption region 15AB can be stably formed.

The laser beam LB can be absorbed by the titanium oxide particles P0 by using, as the laser beam LB, light having a wavelength whose energy is greater than the bandgap energy of the titanium oxide particles P0 in the particle-containing resin 15P. Therefore, irradiation with the laser beam LB to a position away from the side surface S2 of the covering body 15 is suppressed. The absorption region 15AB can thus be stably formed only in the vicinity of the side surface S2 of the covering body 15.

Figure 5A:
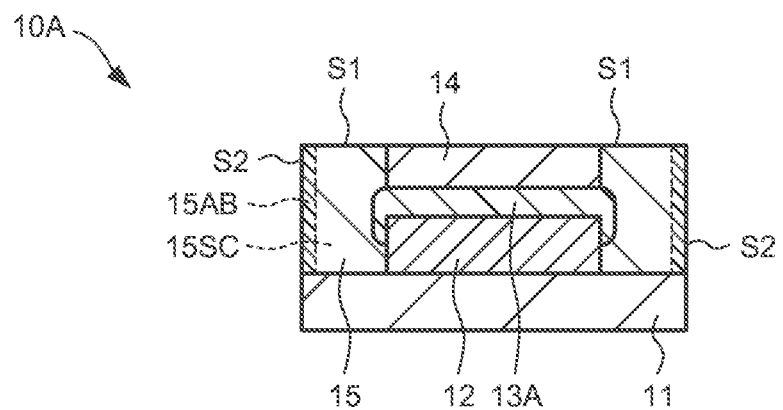
FIG. 5A is a cross-sectional view of a light-emitting device according to a first modification of the first embodiment.

FIG. 5A is a cross-sectional view of a light-emitting device 10A according to a first modification of the first embodiment. The light-emitting device 10A has the same configuration as that of the light-emitting device 10 except for the configuration of a bonding member 13A. In this modification, the bonding member 13A covers a part of the side surface of the light-emitting element 12. That is, the bonding member 13A is formed on the top surface and the side surface of the light-emitting element 12. In this modification, the covering body 15 is in contact with the light-emitting element 12 in a lower region of the side surface of the light-emitting element 12, and covers the light-emitting element 12 via the bonding member 13A in an upper region thereof.

In the light-emitting device 10A, the covering body 15 has a portion above the side surface of the light-emitting element 12 that is not in contact with the side surface of the light-emitting element 12. When the covering body 15 is configured as described above, the light emitted from the side surface of the light-emitting element 12 can be guided by the bonding member 13A to make the light incident on the outer edge portion of the light-transmitting member 14. Accordingly, it is possible to increase the light extracted from the outer edge portion of the light-transmitting member 14. Therefore, the light-emitting device 10A has high contrast. Also in the light-emitting device 10A, the covering body 15 can suppress emission of stray light from the side surface S2.

Figure 5B:
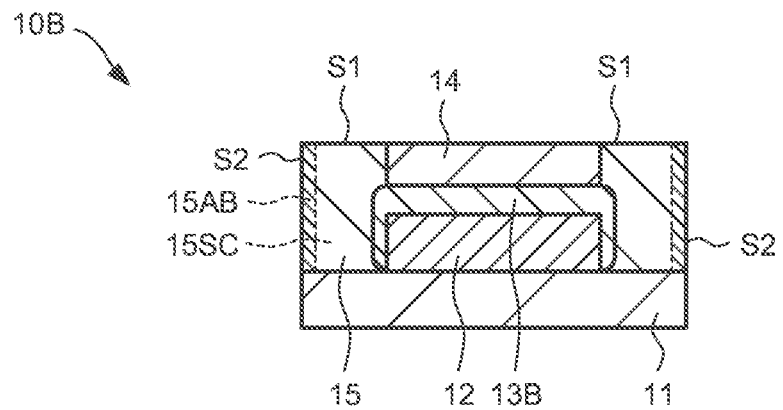
FIG. 5B is a cross-sectional view of a light-emitting device according to a second modification of the first embodiment.

FIG. 5B is a cross-sectional view of a light-emitting device 10B according to a second modification of the first embodiment. The light-emitting device 10B has the same configuration as those of the light-emitting devices 10 and 10A except for the configuration of a bonding member 13B. In the present modification, the bonding member 13B covers the entire side surface of the light-emitting element 12. In other words, the bonding member 13B is in contact with the entire top surface and side surface of the light-emitting element 12. In the present modification, the covering body 15 covers the side surface of the light-emitting element 12 with the bonding member 13B interposed therebetween.

In the light-emitting device 10B, the covering body 15 is not in contact with the side surface of the light-emitting element 12 at all. When the covering body 15 is configured as described above, almost all of the light emitted from the side surface of the light-emitting element 12 can be made incident on the outer edge portion of the light-transmitting member 14 by the bonding member 13B. It is thus possible to increase the light extracted from the outer edge portion of the light-transmitting member 14. The light-emitting device 10B thus has high contrast. Also in the light-emitting device 10B, the covering body 15 can suppress emission of stray light from the side surface S2.

Figure 5C:
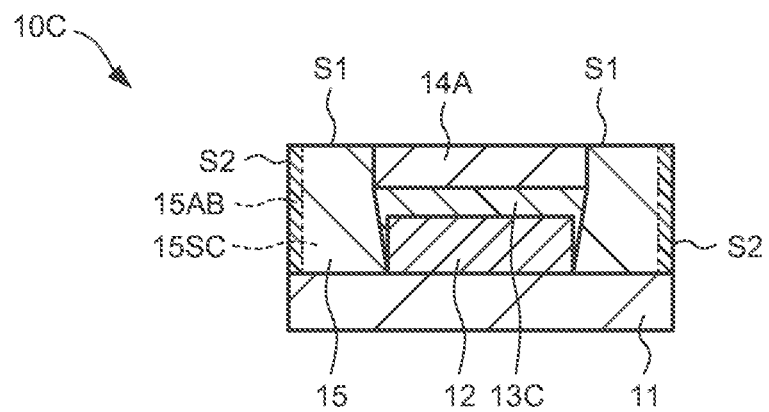
FIG. 5C is a cross-sectional view of a light-emitting device according to a third modification of the first embodiment.

FIG. 5C is a cross-sectional view of a light-emitting device 10C according to a third modification of the first embodiment. The light-emitting device 10C has the same configuration as that of the light-emitting device 10 except for the configuration of a bonding member 13C and a light-transmitting member 14A. In the present modification, the light-transmitting member 14A has a top surface larger than the top surface of the light-emitting element 12. The formed bonding member 13C extends from the side surface of the light-emitting element 12 to the bottom surface of the light-transmitting member 14A.

In the present modification, the light emitted from the light-emitting element 12 enters the entire bottom surface of the light-transmitting member 14A via the bonding member 13C, and is then extracted to the outside from the top surface of the light-transmitting member 14A. The covering body 15 covers the side surface of the bonding member 13C and the side surface of the light-transmitting member 14A. Therefore, for example, the light emitted from the side surface of the light-emitting element 12 can be made incident on the outer edge portion of the light-transmitting member 14A by the bonding member 13C. Therefore, for example, it is possible to provide the light-emitting device 10C in which the size of the light extraction surface is enlarged without changing the size of the light-emitting element 12, and the reduction in contrast is suppressed. Also in the light-emitting device 10C, the covering body 15 can suppress emission of stray light from the side surface S2.

Figure 5D:
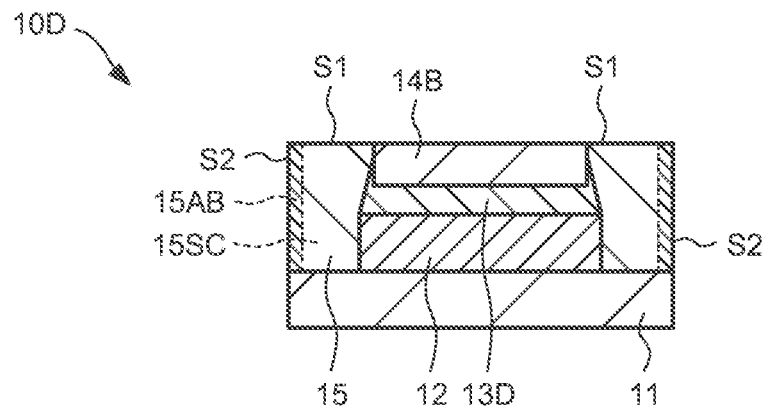
FIG. 5D is a cross-sectional view of a light-emitting device according to a fourth modification of the first embodiment.

FIG. 5D is a cross-sectional view of a light-emitting device 10D according to a fourth modification of the first embodiment. The light-emitting device 10D has the same configuration as that of the light-emitting device 10 except for the configuration of a bonding member 13D and a light-transmitting member 14B. In the present modification, the light-transmitting member 14B has a top surface smaller than the top surface of the light-emitting element 12. The formed bonding member 13D extends from the top surface of the light-emitting element 12 to the side surface of the light-transmitting member 14B.

In the present modification, the light emitted from the light-emitting element 12 enters the bottom surface and the side surface of the light-transmitting member 14B via the bonding member 13D, and then is extracted from the top surface of the light-transmitting member 14B to the outside. The covering body 15 covers the side surfaces of the light-emitting element 12 and the bonding member 13D, and the upper portion of the side surface of the light-transmitting member 14B. Therefore, for example, the size of the light extraction surface can be reduced without changing the size of the light-emitting element 12, thereby providing the light-emitting device 10D having high output and high contrast. Also in the light-emitting device 10D, the covering body 15 can suppress emission of stray light from the side surface S2.

Figure 5E:
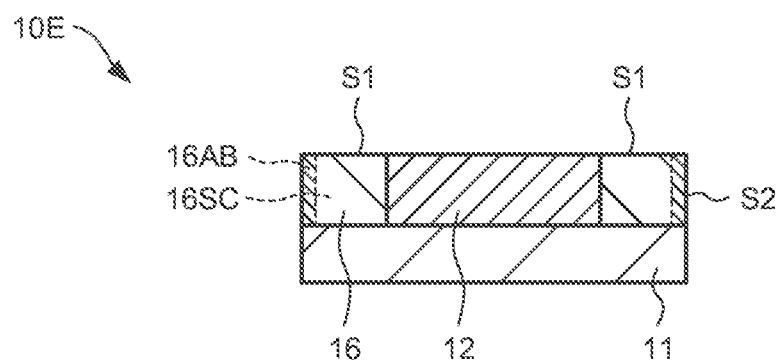
FIG. 5E is a cross-sectional view of a light-emitting device according to a fifth modification of the first embodiment.

FIG. 5E is a cross-sectional view of a light-emitting device 10E according to a fifth modification of the first embodiment. The light-emitting device 10E has the same configuration as that of the light-emitting device 10 except that the light-transmitting member 14 is not provided. The light-emitting device 10E includes the substrate 11, the light-emitting element 12 disposed on the substrate 11, and a covering body 16 covering the side surface of the light-emitting element 12.

The covering body 16 has the same configuration as that of the covering body 15 except that it covers the side surface of the light-emitting element 12. The covering body 16 covers the side surface of the light-emitting element 12, and has a top surface S1 and a side surface S2 as exposed surfaces exposed to the outside. Similarly to the covering body 15, the covering body 16 has a particle group 16PT including a plurality of titanium oxide particles (for example, first to third titanium oxide particles P1 to P3) dispersed in layers such that the density of the oxygen deficient portion P00 in each particle decreases from the side surface S2 toward the light-emitting element 12.

In the present modification, the top surface of the light-emitting element 12 is exposed to the outside. In this case, the emitted light from the light-emitting element 12 is directly extracted to the outside without passing through another medium. Also in the light-emitting device 10E, since the covering body 16 includes the particle group 16PT, a light-emitting device having high output and high contrast is achieved. Also in the light-emitting device 10E, the covering body 16 can suppress emission of stray light from the side surface S2.

In this embodiment, the case where the covering body 15 has the absorption region 15AB having absorptivity for visible light and the scattering-reflection region 15SC having reflectivity for visible light has been described. However, the configuration of the covering body 15 is not limited to this. For example, the light-emitting element 12 may have a configuration that emits light in a band other than visible light. In this case, the absorption region 15AB and the scattering-reflection region 15SC of the covering body 15 should have absorptivity and reflectivity, respectively, with respect to the light in the other wavelength band and/or the light further converted into further other wavelengths by a wavelength converter.

In other words, for example, the particles in the covering body 15, the bandgap structure of the covering body 15, and the medium thereof may be adjusted so as to have a region having light absorptivity and light reflectivity corresponding to the wavelengths of the light emitted from the light-emitting element 12 and the light emitted from the wavelength converter included in the bonding member 13 or the light-transmitting member 14.

In this case, considering that the absorption region 15AB and the scattering-reflection region 15SC are effectively provided in the covering body 15, for example, it is preferable that the titanium oxide particles in the particle group 15PT have an average particle diameter corresponding to the wavelengths, in the covering body 15, of the light emitted from the light-emitting element 12 and/or the light emitted from the wavelength converter included in the bonding member 13 or the light-transmitting member 14.

In consideration of maintaining the mechanical strength, it is preferable that the covering body 15 have a resin medium (for example, a silicone resin) that is integrally formed to disperse the plurality of titanium oxide particles of the particle group 15PT.

In this embodiment, the case where the particle group 15PT has the first to third titanium oxide particles P1 to P3 has been described, but the configuration of the particle group 15PT is not limited to this. For example, the particle group 15PT may be composed of only two types of titanium oxide particles P1 and P2.

In this case, for example, the average density of the oxygen deficient portion P00 in the first titanium oxide particles P1 dispersed in the first region 15A in the vicinity of the side surface S2 of the covering body 15 in the covering body 15 should be larger than the average density of the oxygen deficient portion P00 in the second titanium oxide particles P2 dispersed in the second region 15B inside the first region 15A of the covering body 15. For example, the absorptance of visible light in the first titanium oxide particles P1 dispersed in the first region 15A should be larger than the absorptance of visible light in the second titanium oxide particles P2 dispersed in the second region 16B.

In addition, for example, the covering body 15 should include a plurality of first titanium oxide particles P1 disposed at a position closest to the side surface S2 and having a portion with a bandgap smaller than the energy of the emitted light from the light-emitting element 12 (i.e., the oxygen deficient portion P00) at a high density, and a plurality of second titanium oxide particles P2 disposed closer to the light-transmitting member 14 (or closer to the light-emitting element 12) than the first titanium oxide particles P1 and having a portion with a bandgap smaller than the energy of the emitted light from the light-emitting element 12 (i.e., the oxygen deficient portion P00) at a low density.

For example, the particle group 15PT should include at least the first titanium oxide particles P1. That is, the first titanium oxide particles P1 dispersed in the vicinity of the side surface S2 of the covering body 15 in the particle group 15PT should have the oxygen deficient portion P00.

In the particle group 15PT, the particles constituting the absorption region 15AB and the scattering-reflection region 15SC are not limited to titanium oxide particles. For example, zinc oxide (ZnO) has similar properties to titanium oxide. For example, the bandgap energy of zinc oxide is 3.37 eV, and is capable of transmitting visible light. Zinc oxide has a property of absorbing ultraviolet rays having a wavelength of 355 nm (for example, laser beam LB). The refractive index of zinc oxide is 2.0, which is larger than the refractive index of the silicone resin (1.4 to 1.55). The zinc oxide has a property of absorbing visible light by oxygen defect to form a deep donor level and reduce a bandgap (i.e., by forming a portion corresponding to a portion P00 having a small bandgap).

Therefore, as the particle group 15PT, for example, a metal oxide crystal such as titanium oxide particles and zinc oxide particles can be used. Such a metal oxide crystal has a property of scattering or reflecting light of a predetermined wavelength such as visible light in a crystal state without oxygen defect, and absorbing light of the wavelength due to the oxygen defect. For example, the particles of the metal oxide having such properties may replace the first to third titanium oxide particles P1 to P3, or may be contained in the particle group 15PT in addition to the first to third titanium oxide particles P1 to P3.

In addition to the titanium oxide particles or the zinc oxide particles, particles that scatter light emitted from the light-emitting element 12 and/or light emitted from the wavelength converter contained in the bonding member 13 or the light-transmitting member 14 may be added to the particle group 15PT. Examples of the particles may include particles of a metal carbide, a metal oxide, and a metal nitride, such as silicon carbide (SiC), silicon nitride ($Si_2N_3$), gallium nitride (GaN), aluminum nitride (AlN), and aluminum oxide ($Al_2O_3$).

That is, the covering body 15 should have at least a particle group 15PT including a plurality of metal oxide particles having a light scattering property and dispersed in the covering body 15. For example, when the particle group 15PT includes a plurality of particles including particles other than titanium oxide particles and zinc oxide particles, the plurality of particles may be dispersed at a uniform density in the covering body 15, or dispersed so as to gradually increase in density from the top surface S1 to the substrate 11. For example, the particles included in the particle group 15PT as a whole may be dispersed at the above-described concentration.

In this embodiment, the case where the absorption region 15AB is not provided in the top surface S1 of the covering body 15 has been described. However, the absorption region 15AB may be provided in the top surface S1 of the covering body 15. For example, when the contrast is given priority among the output and the contrast, the covering body 15 may have the absorption region 15AB in the vicinity of the top surface S1.

Thus, for example, the light-emitting device 10 includes the substrate 11, the light-emitting element 12 disposed on the substrate 11, the light-transmitting member 14 disposed on the light-emitting element 12, and the covering body 15 disposed on the substrate 11 so as to surround the light-transmitting member 14 and cover the side surface of the light-transmitting member 14.

The covering body 15 has the particle group 15PT including the plurality of metal oxide particles having a light scattering property and dispersed in the covering body 15. The metal oxide particles (for example, the first titanium oxide particles P1) dispersed in the vicinity of the side surface S2 of the covering body 15 in the particle group 15PT have the portion P00 in which oxygen is deficient (that is, a portion having a bandgap smaller than other portions in each particle). It is thus possible to provide the light-emitting device 10 with a simple configuration and high output and in which emission of stray light from the side surface S2 is suppressed.

For example, the light-emitting device 10E includes the substrate 11, the light-emitting element 12 disposed on the substrate 11, and the covering body 16 disposed on the substrate 11 so as to surround the light-emitting element 12 and cover the side surface of the light-emitting element 12. The covering body 16 has the particle group 16PT including the plurality of metal oxide particles having a light scattering property and dispersed in the covering body 16. The metal oxide particles (for example, the first titanium oxide particles P1) dispersed in the vicinity of the side surface S2 of the covering body 16 in the particle group 16PT have the portion P00 in which oxygen is deficient. It is thus possible to provide the light-emitting device 10E with a simple configuration and high output and in which emission of stray light from the side surface S2 is suppressed.

For example, the oxygen deficient portion P00 is a portion in which oxygen of the metal oxide particles is deficient by irradiation with the laser beam LB. That is, the covering body 15 or 16 has the region in which the side surface S2 of the covering body 15 or 16 has been irradiated with the laser beam LB. As a result, the absorption region 15AB or 16AB for suppressing emission of stray light from the side surface S2 can be formed in the side surface S2 of the covering body 15 or 16. It is thus possible to provide the light-emitting device 10 which can be easily manufactured, and which has a simple configuration and high output and in which emission of stray light from the side surface S2 is suppressed.

Second Embodiment

Figure 6A:
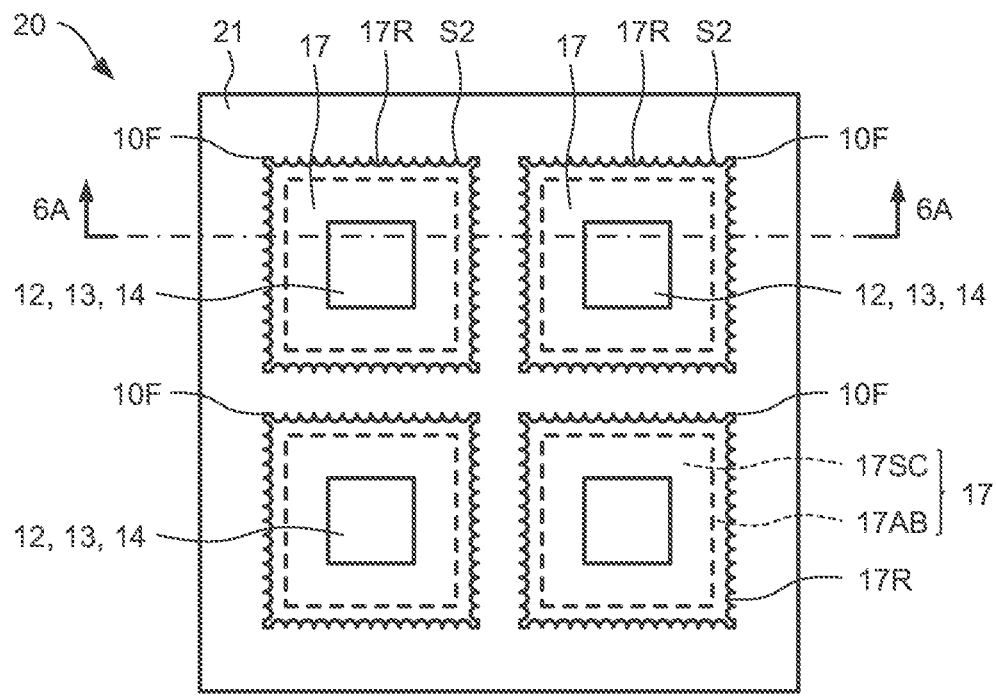
FIG. 6A is a top view of a light-emitting device module according to a second embodiment.
Figure 6B:
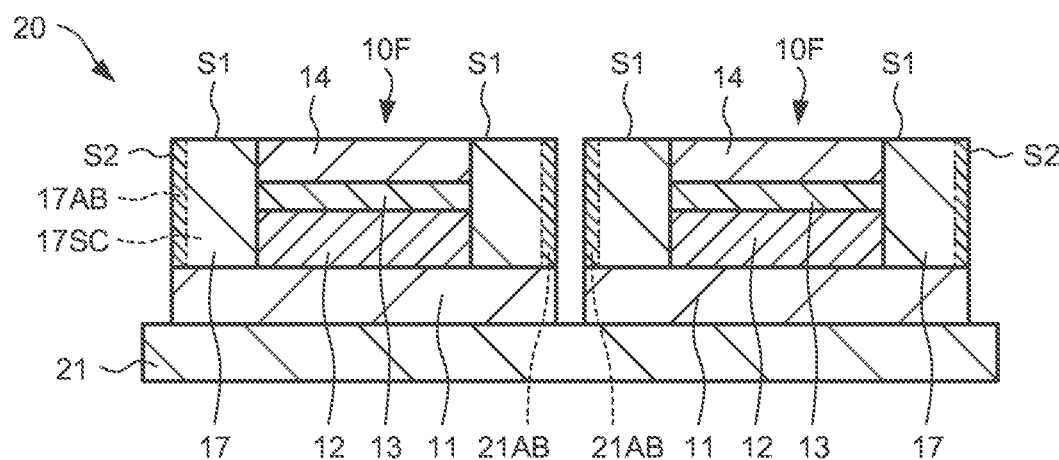
FIG. 6B is a cross-sectional view of the light-emitting device module according to the second embodiment.
Figure 6C:
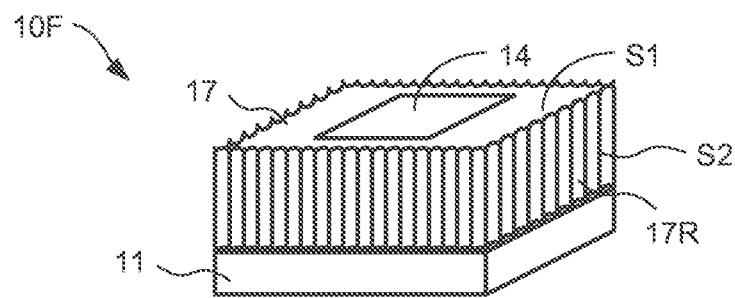
FIG. 6C is a perspective view of a covering body in the light-emitting device according to the second embodiment.

FIG. 6A is a top view of a light-emitting device module 20 according to a second embodiment. FIG. 6B is a cross-sectional view of the light-emitting device module 20. FIG. 6B is a cross-sectional view taken along line 6B-6B of FIG. 6A. FIG. 6C is a perspective view of a light-emitting device 10F in the light-emitting device module 20. The light-emitting device module 20 includes a plurality of the light-emitting devices 10F.

In this embodiment, the light-emitting device module 20 includes the plurality of light-emitting devices 10F disposed side by side on a module substrate 21. In this embodiment, four light-emitting devices 10F are disposed in a matrix form in two rows and two columns on the module substrate 21. Each of the light-emitting devices 10F includes a light-transmitting member 14 disposed on each of the light-emitting elements 12 via a bonding member 13.

Each of the light-emitting devices 10F has a covering body 17 which is disposed on the substrate 11 as an individual substrate so as to surround the light-transmitting member 14 and cover the side surface of the light-transmitting member 14.

In this embodiment, the covering body 17 has a plurality of recessed portions 17R on the side surface S2. In this embodiment, as shown in FIG. 6C, each of the recessed portions 17R of the covering body 17 extends in a groove-like shape between the top surface S1 of the covering body 17 and the substrate 11. Although not illustrated, each of the recessed portions 17R has a scaly inner wall.

The covering body 17 can be formed, for example, by superimposing an irradiated laser beam LB having a wavelength in the ultraviolet region on the side surface S2 of the particle-containing resin 15P (that is, by irradiation with the laser beam LB a plurality of times). More specifically, the irradiation with laser beam LB having a wavelength of 355 nm and an output of 25 kW/cm$^2$ or more with a specified pattern and the irradiation with the laser beam LB having the same pattern again can successively sublimate and remove the silicone resin from the surface, so that traces of irradiation with the laser beam LB remain on the surface. As a result, grooves corresponding to the beam diameter of the laser beam LB and its moving direction are formed on the side surface S2 of the particle-containing resin 15P. These laser traces become the recessed portions 17R of the covering body 17.

Note that the recessed portions 17R of the covering body 17 can be formed not only by the irradiation with the laser beam LB a plurality of times, but also by adjusting, for example, the output of the laser beam LB, the scanning speed thereof, and the like. The shape of the recessed portions 17R is not limited to the shape illustrated in the drawings. For example, projected portions may be formed on the top surface of the covering body 17, or a continuous wave-shaped projected-recessed portion may be formed on the top surface thereof. The covering body 17 should have a side surface S2 having various recessed and projected portions.

The direction in which the grooves of the recessed portions 17R extend may be a direction parallel to the substrate 11 and the top surface S1, an oblique direction having an angle with respect to the substrate 11, or the like. The grooves serving as the recessed portions 17R may have a shape other than a linear shape, for example, a wavy shape.

Also in this embodiment, each of the covering bodies 17 has the particle group 15PT including a plurality of metal oxide particles (for example, titanium oxide particles) having a light scattering property and dispersed in the covering body 17, similarly to the covering body 15. The metal oxide particles (for example, the first titanium oxide particles P1) dispersed in the vicinity of the side surface S2 of the covering body 17 in the particle group 15PT have the portion P00 with oxygen defect (that is, a portion having a bandgap smaller than other portions in each particle).

In this embodiment, each side surface S2 of the covering body 17 has the recessed portions 17R repeatedly provided as shown in FIG. 6C, for example, so that the area of the surface exposed to the outside is increased as compared with a flat surface, for example. As a result, the surface area of the absorption region 17AB provided to the covering body 17 is increased. Therefore, the covering body 17 absorbs light entering the covering body 17 from the side surface of the light-transmitting member 14 (for example, light such as the light L3 in FIG. 3) with high efficiency. The light-emitting device 10F thus has a suitable configuration when, for example, the contrast is given priority among the contrast and output.

In this embodiment, it is possible to suppress crosstalk of light between adjacent light-emitting devices 10F. For example, in this embodiment, the light-emitting device module 20 is configured to independently drive each of the light-emitting devices 10F. In other words, each of the light-emitting devices 10F is turned on and off independently of each other. For example, such a configuration can be used in applications where it is preferable to vary the irradiated region (for example, the light distribution region), specifically, used in illumination applications such as vehicular headlights.

In this case, it is required not only that the contrast of each irradiated region is high, but also that light corresponding to one irradiated region is not directed toward another irradiated region. In this embodiment, the light-emitting device module 20 has a configuration suitable for such a use application.

For example, in the case of the illumination applications as described above, it is preferable that a dark portion of light corresponding to the region between the adjacent light-emitting devices 10F be not provided. Therefore, it is preferable that the light-emitting devices 10F be disposed as close as possible. The light-emitting device module 20 can sufficiently respond to such requirements.

Specifically, by providing the absorption region 17AB in the side surface S2 of the covering body 17, it is possible to reliably suppress cross talk of light between the side surfaces of the light-emitting devices 10F. Therefore, other members such as a light reflecting member or absorbing member may not be provided to prevent crosstalk. For example, even when the covering body 17 is located to be brought into contact with another adjacent covering body 17, crosstalk is reliably suppressed. Two absorption regions 17AB are provided between the adjacent light-emitting devices 10F and between the adjacent light-transmitting members 14. Therefore, crosstalk between the light-emitting devices 10F can be reliably suppressed.

For example, in the case of the light-emitting device module 20 in which the light-emitting devices 10F are disposed adjacently to each other on the module substrate 21 in a lattice shape (for example, arranged in 6 rows and 24 columns within a rectangle), light such as the light L3 emitted from the light-emitting devices 12 of the 24 light-emitting devices 10F arranged in the first row toward the 24 light-emitting devices 10F arranged in the second row is attenuated by being reflected by the scattering-reflection regions 17SC of the covering bodies 17 in the side surfaces of the light-emitting elements 12, and then further attenuated by being absorbed by the absorption regions 17AB.

Further, slight light outputted from the side surface S2 of the covering body 17 in the light-emitting device 10F in the first row enters the covering body 17 from the side surface S2 of the covering body 17 in each of the light-emitting devices 10F in the second row. Then, the light is absorbed by the absorption region 15AB to be attenuated, and is reflected by the scattering-reflection region to be attenuated. Therefore, only a small amount of remaining light reaches the light-emitting devices 10F in the second row. That is, since each of the light-emitting devices 10F has the covering body 17, light such as the light L3 is reliably attenuated.

For example, when the light-emitting device 10 of Example 1-2 shown in Table 1 is used, the specific intensity of the absorption region 17AB is 0.25 (¼). Thus, the light reaching the light-emitting element 12 in the second row from the light-emitting element 12 in the first row through the two absorption regions 17AB is remarkably attenuated by ¹⁄₁₆ (=¼×¼) compared to the light-emitting device 100 of the comparative example. Therefore, crosstalk can almost be reliably prevented.

In this embodiment, the case where the recessed portions 17R are formed on the entire side surface S2 of the covering body 17 has been described. However, the recessed portions 17R may be formed only in part of the side surface S2 of the covering body 17. The shapes of the recessed portions 17R are also not limited to those shown in FIGS. 6A and 6C.

The recessed portions 17R may not be provided. The covering body 17 should have the particle group 15PT so as to form the absorption region 15AB in the side surface S2. As a result, it is possible to suppress crosstalk of light between the light-emitting elements 12 and between the light-transmitting members 14.

Electronic components other than the light-emitting device 10F, for example, a resistor, a capacitor, an IC chip, a coil, and a connector may be disposed on the module substrate 21. In this case, since the light-emitting device 10F has a structure which prevents leakage of light from the side surface S2 toward the outside of the light-emitting device 10F, cross talk caused by reflected light from electronic components other than the light-emitting device 10F becoming stray light can also be suppressed.

In the light-emitting device 10F of the light-emitting device module 20, the surface other than the top surface S1 and the light-transmitting member 14 may be covered with a weather-resistant fixing agent. As a result, for example, corrosive gas containing phosphorus, sulfur, chlorine, peroxide, or the like can be prevented from permeating into the absorption region 15AB of the light-emitting device 10F and thereby altering the titanium oxide particles P1 and P3.

A plurality of light-emitting devices 10F may be disposed on the module substrate 21 so as to be in contact with each other. In this case, a fixing agent can be made to permeate between the light-emitting devices 10F by the recessed portions 17R provided on the side surface S2 of the light-emitting device 10F. Note that if a pigment (particle) or a dye having a light-shielding property (light absorptivity, light reflectivity) is added to the fixing agent, crosstalk can be further prevented.

As described above, the light-emitting device module 20 includes the module substrate 21 and the plurality of light-emitting devices 10F disposed side by side on the module substrate 21. Each of the light-emitting devices 10F includes the individual substrate 11, the light-emitting element 12 disposed on the individual substrate 11, the light-transmitting member 14 disposed on the light-emitting element 12, and the covering body 17 disposed on the individual substrate 11 so as to surround the light-transmitting member 14 and cover each of the side surfaces of the light-transmitting member 14.

Each of the covering bodies 17 has the particle group 15PT composed of a plurality of metal oxide particles having a light scattering property and dispersed in each of the covering bodies 17. The metal oxide particles dispersed in the vicinity of the side surface S2 of the covering body 17 in the particle group 15PT have the portion P00 in which oxygen is deficient (that is, a portion in which the bandgap is smaller than that of other portions in each particle). Therefore, it is possible to provide the light-emitting device module 20 having a simple configuration and high output and in which crosstalk between the light-emitting devices 10F is suppressed.

This application is based on a Japanese Patent application No. 2018-229936 which is hereby incorporated by reference.

What is claimed is:

1. A light-emitting device comprising:
   a substrate;
   a light-emitting element disposed on said substrate;
   a light-transmitting member disposed on said light-emitting element; and
   a covering body disposed on said substrate so as to surround said light-transmitting member and cover a side surface of said light-transmitting member,
   wherein:
   said covering body has a particle group including a plurality of metal oxide particles having a light scattering property and dispersed in said covering body, and
   those ones of the metal oxide particles existing in a vicinity of a side surface of said covering body have a portion having a bandgap smaller than that of other portions in each particle.

2. The light-emitting device according to claim 1, wherein said covering body has one resin matrix configured to support said plurality of metal oxide particles and transmit visible light and ultraviolet light.

3. The light-emitting device according to claim 1, wherein said plurality of metal oxide particles are dispersed in said covering body with a uniform density.

4. The light-emitting device according to claim 1, wherein said plurality of metal oxide particles are dispersed in said covering body so that a density thereof gradually increases from a top surface of said covering body toward a bottom surface of said covering body adjacent to said substrate.

5. The light-emitting device according to claim 1, wherein an absorptance of visible light in the metal oxide particles dispersed in a first region in a vicinity of said side surface of said covering body is larger than an absorptance of visible light in the metal oxide particles dispersed in a second region which is a region inside said first region of the covering body.

6. The light-emitting device according to claim 1, wherein each of said metal oxide particles comprises one of a titanium oxide particle and a zinc oxide particle.

7. The light-emitting device according to claim 1, wherein said plurality of metal oxide particles are dispersed in a range of 5 to 70 wt % in said covering body.

8. The light-emitting device according to claim 1, wherein said particle group has said plurality of metal oxide particles and a covering film configured to protect said plurality of metal oxide particles from deterioration by ultraviolet rays.

9. The light-emitting device according to claim 6, wherein said metal oxide particles having a portion having a bandgap smaller than that of other portions are dispersed in a region within a depth range of 20 μm or less from said side surface of said covering body.

10. A light-emitting device module comprising:
    a module substrate; and
    a plurality of light-emitting devices disposed side by side on the module substrate,
    wherein:
    each of the plurality of light-emitting devices includes:
    an individual substrate,
    a light-emitting element disposed on said individual substrate,
    a light-transmitting member disposed on said light-emitting element, and
    a covering body disposed on said individual substrate so as to surround said light-transmitting member and cover a side surface of said light-transmitting member,
    said covering body has a particle group including a plurality of metal oxide particles having a light scattering property, and
    those ones of the metal oxide particles existing in a vicinity of a side surface of said covering body have a portion having a bandgap smaller than that of other portions in each particle.

11. The light-emitting device module according to claim 10, wherein said covering body has a plurality of recessed and projected portions on said side surface.

12. A light-emitting device comprising:
    a substrate;
    a light-emitting element disposed on said substrate; and
    a covering body disposed on said substrate so as to surround said light-emitting element and cover a side surface of said light-emitting element,
    wherein:
    said covering body has a particle group including a plurality of metal oxide particles having a light scattering property, and
    those ones of the metal oxide particles existing in a vicinity of a side surface of said covering body have a portion having a bandgap smaller than that of other portions in each particle.

13. A method for manufacturing the light-emitting device according to claim 1, the method comprising:
    disposing the light-emitting element on said substrate;
    disposing the light-transmitting member on said light-emitting element;
    disposing the covering body on said substrate so as to cover a side surface of said light-emitting element and the side surface of said light-transmitting member; and
    irradiating laser light on the side surface of said covering body so as to cause oxygen deficiency of the metal oxide particles existing in the vicinity of the side surface of said covering body to form a portion in said covering body having a bandgap smaller than that of another portion in said covering body.

14. The method for manufacturing the light-emitting device according to claim 13, wherein each of said metal oxide particles comprises one of a titanium oxide particle and a zinc oxide particle.

* * * * *